(12) United States Patent
Mullen et al.

(10) Patent No.: US 11,280,685 B2
(45) Date of Patent: Mar. 22, 2022

(54) ADDITIVE MANUFACTURED RESISTANCE TEMPERATURE DETECTOR

(71) Applicant: Goodrich Corporation, Charlotte, NC (US)

(72) Inventors: James A. Mullen, Wadsworth, OH (US); Reid Philip Beery, Rittman, OH (US); Brandon Hein, Stow, OH (US)

(73) Assignee: Goodrich Corporation, Charlotte, NC (US)

( * ) Notice: Subject to any disclaimer, the term of this patent is extended or adjusted under 35 U.S.C. 154(b) by 305 days.

(21) Appl. No.: 16/148,283

(22) Filed: Oct. 1, 2018

(65) Prior Publication Data

US 2020/0103288 A1 Apr. 2, 2020

(51) Int. Cl.
| | | |
|---|---|---|
| *G01K 7/00* | (2006.01) | |
| *G01K 7/16* | (2006.01) | |
| *G01K 1/08* | (2021.01) | |
| *G01K 1/14* | (2021.01) | |

(52) U.S. Cl.
CPC ............... *G01K 7/16* (2013.01); *G01K 1/08* (2013.01); *G01K 1/14* (2013.01)

(58) Field of Classification Search
None
See application file for complete search history.

(56) References Cited

U.S. PATENT DOCUMENTS

| | | |
|---|---|---|
| 3,781,749 A | 12/1973 | Iles et al. |
| 4,146,957 A | 4/1979 | Toenshoff |
| 4,164,539 A | 8/1979 | Johnston |
| 5,181,007 A | 1/1993 | Friese et al. |
| 6,004,485 A | 12/1999 | Osada |
| 6,353,381 B1 | 3/2002 | Dietmann et al. |
| 6,406,181 B1 | 6/2002 | Mueller et al. |
| 7,635,091 B2 | 12/2009 | Engler et al. |
| 9,029,180 B2 | 5/2015 | Britton et al. |
| 2014/0318699 A1* | 10/2014 | Longinotti-Buitoni ...... A41D 1/002 156/247 |
| 2015/0337157 A1* | 11/2015 | Iida .......................... C08F 2/26 524/724 |
| 2016/0025517 A1* | 1/2016 | Giedd ..................... G01K 7/16 324/691 |
| 2016/0131537 A1* | 5/2016 | Aliane .................... G01K 7/16 374/185 |

(Continued)

FOREIGN PATENT DOCUMENTS

| | | |
|---|---|---|
| CN | 107664520 A | 2/2018 |
| EP | 3058312 A1 | 8/2016 |
| WO | WO2016123177 A1 | 8/2016 |

OTHER PUBLICATIONS

"Object1000 plus product overview", 2016, (downloaded by way back machine). (Year: 2016).*

(Continued)

*Primary Examiner* — Lisa M Caputo
*Assistant Examiner* — Nasir U. Ahmed
(74) *Attorney, Agent, or Firm* — Kinney & Lange, P.A.

(57) ABSTRACT

A method of making a resistance temperature detector includes additively manufacturing a conductive ink on a flexible substrate and applying the resistance temperature detector to a geometrically complex surface of a component requiring heating, or directly additive manufacturing the resistance temperature detector onto that surface.

14 Claims, 2 Drawing Sheets

(56) References Cited

U.S. PATENT DOCUMENTS

| | | | |
|---|---|---|---|
| 2016/0273687 A1* | 9/2016 | Rubinski | G01L 5/24 |
| 2017/0106585 A1* | 4/2017 | Nino | G01M 5/0083 |
| 2017/0150602 A1* | 5/2017 | Johnston | H05K 1/115 |
| 2017/0164461 A1* | 6/2017 | Lathrop | H05K 1/0366 |
| 2017/0191879 A1 | 7/2017 | Martin | |
| 2017/0196513 A1* | 7/2017 | Longinotti-Buitoni | H05K 1/0283 |
| 2017/0226362 A1 | 8/2017 | Fratello et al. | |
| 2018/0266908 A1 | 9/2018 | Yamamoto et al. | |

OTHER PUBLICATIONS

Advanced Data Logging Electronics for High Pressure and Temperature Subsurface Environments by A. Matt Francis (PI), Jim Holmes, Matthew Barlow, Nick Chiolino, Ian Getreu—Ozark IC, Inc,. MPH05 Simulation Overview dated Dec. 2017. https://www.energy.gov/sites/prod/files/2017/12/f46/Ozark%20Integrated%20Circuits_Advanced%20Data_Poster.pdf.

All-Printed Differential Temperature Sensor for the Compensation of Bending Effects by Shawkat Ali, Arshad Hassan, Jinho Bae*, Chong Hyun Lee, and Juho Kim—American Chemical Society. Article dated Oct. 8, 2016. https://pubs.acs.org/doi/ipdf/10.1021/acs.langmuir.6b02885.

"Printed Temperature Sensor Demo at IDTechEx Printed Electronics Europe", YouTube video, dated Jul. 2015.

Extended European Search Report for EP Application No. 19200517.1, dated Feb. 24, 2020, pp. 9.

* cited by examiner

ADDITIVE MANUFACTURED RESISTANCE TEMPERATURE DETECTOR

BACKGROUND

This application relates generally to aircraft components and specifically to temperature monitoring of aircraft components.

Heated assemblies for aircraft (composite or metallic), used for ice protection and environment heating, require a temperature sensor to monitor and control temperature of the assembly. Resistance temperature detectors (RTDs) are temperature sensors that contain a resistor that changes resistance value as the temperature changes. RTDs are generally accurate, reliable, and stable temperature detectors.

Traditional RTDs, such as wire and bobbin wound or etched metal foil RTDs, have low fatigue life and can be the life limiting component of an assembly in a high strain environment. This is due in part to the materials used for the RTDS (thin metal for etched RTDs, or wire for bobbin wound RTDs) having relatively low fatigue resistance. Additionally, traditional RTDs can be difficult to adhere to complex geometric surfaces.

SUMMARY

This application discloses resistance temperature detectors that are additively manufactured to increase operating life and to enable the placement of resistance temperature detectors (RTDs) onto any geometric surface.

In a first embodiment, an assembly includes a resistance temperature detector for a component, one or more leads electrically connected to the resistance temperature detector, and a controller electrically connected to the resistance temperature detector through the one or more leads. The resistance temperature detector is configured to change resistance as the component temperature changes. The resistance temperature detector is additively manufactured and includes one or more layers of a conductive ink.

In a second embodiment, a resistance temperature detector includes an additively manufactured resistance element that changes resistance value as its temperature changes, wherein the resistance element comprises one or more layers of a conductive ink, and one or more electrical leads connected to the resistance element.

In a third embodiment, a method of making a resistance temperature detector includes additively manufacturing a conductive ink element having one or more layers of conductive ink to form a resistance element, and electrically connecting the resistance element with one or more leads.

DETAILED DESCRIPTION

The disclosed additive manufactured RTD is constructed on a substrate and encapsulated as a stand-alone sensor, or as a sensor additively manufactured directly onto the composite/metallic structure for primary control of a heated component surface. Additively manufacturing the RTD through processes such as screen-printing, ink-jet or aerosol-jet printing increases the fatigue life compared to traditional RTDs by allowing the RTD to match the geometric surface profile of the assembly to which it is applied. Furthermore, leads could be integrally printed during the RTD production process to eliminate joints.

Figure 1:
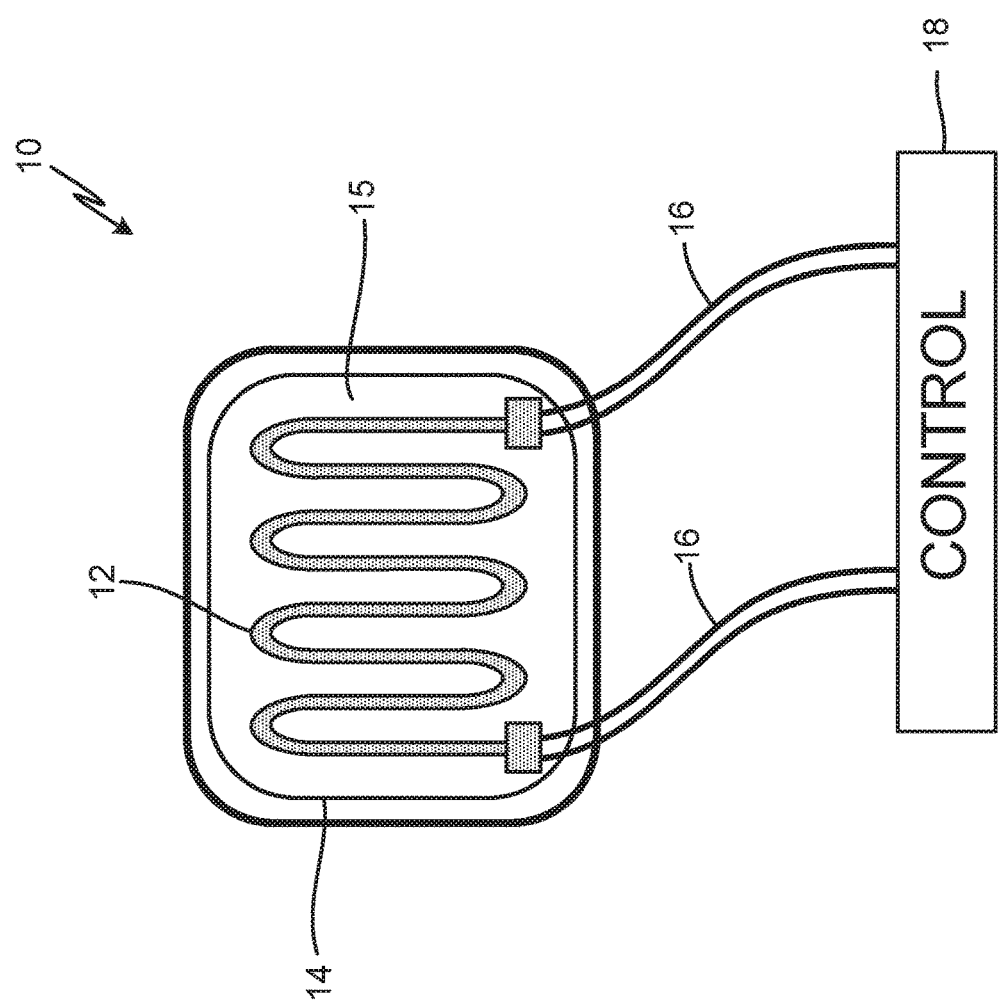
FIG. 1 is a two dimensional view of an additive manufactured resistance temperature detector (RTD).

FIG. 1 is a two dimensional view of additive manufactured resistance temperature detector (RTD) 10. Resistance temperature detectors (RTDs) are sensors used to measure temperature of a component or assembly. RTD 10 includes resistance element 12, substrate 14, encapsulating material 15, and connector leads 16 connecting RTD 10 to controller 18.

RTD 10 contains resistance element 12 that changes resistance value as its temperature changes. The resistance element 12 material is a material whose resistance at various temperatures has been documented to have a predictable change in resistance as temperature changes. For this reason, RTD 10 is highly accurate and allows for repeatable measurements.

Resistance element 12 is an additive manufactured component made of one or more layers of a conductive ink such as a nano-carbon, or nano-silver loaded ink additively manufactured on substrate 14 with a thickness between 0.001"-0.030". Resistance element 12 has a repeatable resistance versus temperature relationship that allows for monitoring of temperature of the surface to which RTD 10 is applied by measuring electrical resistance.

Prior Art RTDs (not illustrated) use fine metallic wire wrapped around ceramic or glass bobbin. However, such prior art elements are very fragile and have to be placed inside sheathed probes for protection. Other prior art RTDs (not illustrated) include wire wound or etched metal foil and also have inferior fatigue resistance when compared to printed circuits. In contrast, an additively manufactured resistance element is more robust. Resistance element 12 can be encapsulated in a dielectric to protect from external elements.

Substrate 14 can be, for example, a flexible substrate on which resistance element 12 is additively manufactured. Alternatively, RTD 10 resistance element 12 can be additively manufactured directly onto the surface of the component which RTD 10 will monitor. Resistance element 12 is sealed to substrate 14 (or the surface of the component) by encapsulating material 15, which protects RTD 10 from external contaminants.

In either case, leads 16 create an electrical connection to terminals on resistance element 12. Leads 16 can be conventional wires, or can be additively manufactured along with resistance element 12.

Controller 18 is in communication with RTD 10 via leads 16. Controller 18 allows for the reading of temperature data from RTD 10 and can be in communication with a controller capable of analyzing the temperature data to determine the heated component's power ON and OFF times.

Controller 18 can include one or more processors and controller-readable memory encoded with instructions that, when executed by the one or more processors, cause controller 18 to operate in accordance with techniques described herein. Examples of the one or more processors include any one or more of a microprocessor, a digital signal processor (DSP), an application specific integrated circuit (ASIC), a field-programmable gate array (FPGA), or other equivalent discrete or integrated logic circuitry. Controller-readable memory of controller 18 can be configured to store information within controller 18 during operation. The controller-readable memory can be described, in some examples, as controller-readable storage media. In some examples, a controller-readable storage medium can include a non-transitory medium. The term "non-transitory" can indicate that the storage medium is not embodied in a substrate wave or a propagated signal. In certain examples, a non-transitory storage medium can store data that can, over time, change (e.g., in RAM or cache). Controller-readable memory of controller 18 can include volatile and non-volatile memories. Examples of volatile memories can include random access memories (RAM), dynamic random access memories (DRAM), static random access memories (SRAM), and other forms of volatile memories. Examples of non-volatile memories can include magnetic hard discs, optical discs, floppy discs, flash memories, or forms of electrically programmable memories (EPROM) or electrically erasable and programmable (EEPROM) memories. Controller 18 can be a stand-alone device dedicated to the operation of the catalytic oxidation unit, or it can be integrated with another controller.

In practice, RTD 10 has a repeatable resistance versus temperature relationship and operating temperature range, somewhere between −40 degrees Fahrenheit and 400 degrees Fahrenheit. The exact range of RTD 10 depends on the ink from which resistance element is made, and the size, shape, and use of RTD 10. Likewise, RTD 10 will have a resistance range between 150 ohms and 2500 ohms, or preferably between 200 ohms and 1,000 ohms, which can be more specific depending on RTD 10 materials, size, and function.

RTD 10 can be manufactured in at least two ways: for example, onto a flexible substrate, which is then applied to a component surface, or directly additively manufactured onto the component surface.

In the first example, a flexible substrate is prepared. The flexible substrate must be able to conform to the curvature of the component surface to which RTD 10 will be applied. The substrate can be, for example, neoprene, TPU, polyimide, urethane, fabric, or other materials. In some instances, the substrate must be cleaned or cured before printing using conventional curing methods.

The substrate must be compatible with both the component and conductive ink used to make the RTD. For instance, the flexible substrate must be able to withstand heating occurring with the component, and maintain adhesion to the component. Additionally, the flexible substrate should be erosion resistant so that RTD 10 on the flexible substrate stays on the component for the component lifetime. This is highly dependent on the specific component and conductive ink chosen. For example, if the component is the leading edge of a wing, the flexible substrate must be able to withstand light, temperature, and weather external to the aircraft. In contrast, if the component is a heated floor panel, the flexible substrate needs to withstand the heater within the floor panel and the pressure of passengers stepping on the panel.

Next, the conductive ink is additively manufactured onto the substrate to form or make layers of the RTD. Examples of commercially available conductive inks include Loctite CT 5030, Loctite Ablestik 8008MD, Loctite EDAG 6017SS, Loctite EDAG 725A, Bonderite S-FN 109, DuPont PE671, DuPont PE873, and DuPont PE410. Typically, ink-jet, aerosol-jet, or screen printing can be used depending on the type of ink chosen, desired layer thickness, and dimensions of the RTD. For two dimensional (2D) printing on a substrate using screen printing, the screen specifications such as mesh count, size, and material are selected based on the conductive ink being used, the desired thicknesses of the conductive ink required to be printed, and the substrate to be printed on.

For ink-jet and aerosol-jet methods, the print head should be moveable at least on (x, y, z) axes and programmable with the geometric pattern specific to the component on which the RTD will be applied. The specific print heat and additively manufacturing method will be dependent on the exact ink formulations and requirements set forth by the manufacturer of the ink. Ink-jet and aerosol-jet printers and printing heads can be utilized for 2D applications, such as printing on a substrate, but ideally can be adapted to enable three dimensional (3D) printing capabilities by attaching the printing heads onto a numerically controlled robotic arm. For example, 3D ink-jet and aerosol-jet printing equipment developed by Ultimaker (3D ink-jet equipment) or Optomec (3D aerosol-jet equipment) can be used. For ink-jet or aerosol-jet methods, the printing head temperatures, flow rates, nozzle sizes are also selected based on the conductive ink being printed, required conductive ink thickness, and substrate to be printed on.

The printing is accomplished in an additive manner, meaning the print head takes one or more passes before a desired element resistance is reached in the desired geometric pattern and desired dimensions, which matches the curvature of the component.

The resistance element 12 of additively manufactured RTD 10 should have a thickness of approximately between 0.0001"-0.010". Multiple passes are done by the print head when applying the conductive ink. Each layer deposited through individual passes of the print head should have a thickness of approximately 1-100 microns. Multiple passes allows for slow buildup of the conductive ink to the correct resistance and geometric pattern. Additionally, multiple passes allows for tailoring of the conductive ink on certain portions of the component surface. For instance, ink with a lower resistance (e.g., with a higher number of layers) and a higher thickness may be additively manufactured on a first portion of the component compared to a second portion of the component.

After additively manufacturing the RTD, the conductive ink is cured, and leads 16 are connected to resistance element 12. The curing process of additively manufactured RTD 10 depends on the type of ink used. In some instances, the ink will air dry. In other instances, heat, infrared exposure, UV exposure, or other methods can be used to cure the conductive ink.

After RTD 10 is additively manufactured onto the substrate 14, it may be encapsulated with a dielectric material, such as acrylic, neoprene, polyurethane, polyimide, silicone, or an epoxy-fiberglass matrix, to prevent erosion and electrical shorting. For example, encapsulating materials with high dielectric strength, such as polyimide (DuPont Kapton®), may only be required to be 0.001" thick while materials with lower dielectric strength, such as polyurethane or neoprene rubber, may be as thick as 0.015-0.030". Encapsulating material 15 can then be cured through conventional methods.

Finally, RTD 10 may be applied to the component surface with an adhesive such as a pressure sensitive adhesive, epoxy, or cement adhesive, depending on the component and environment requirements. The flexible substrate 14 allows for conforming of RTD 10 to curvature of the component surface without creating unnecessary stresses within RTD 10. The use of a flexible substrate 14 allows RTD 10 to form to the shape of the surface of the component to which it is applied.

In the second example, the conductive ink is additively manufactured directly onto the component surface. In some instances, where the component is a conductive material (e.g., metallic), an intermediary dielectric layer must first be applied to the surface of the component before the conductive ink is additively manufactured. This layer may be a supplemental substrate bonded to the surface, but may also be a dielectric type ink that is applied via the same method being used to print the RTD.

If the conductive ink is additively manufactured directly onto the component surface, the additive manufacturing method used must allow for a print head that can move in three dimensions and navigate the geometry of the component surface while printing Like the first example, the print head will make multiple passes to form one or more layers until the resistance and thickness of RTD 10 is correct. Methods such as screen printing, ink-jet or aerosol-jet printing and others can be used, the selected method would be determined based on the complexity of the shape on which RTD 10 is being additively manufactured. The additive manufacturing process is similar to that described in reference to the first example. Once additively manufactured, RTD 10 must be electrically connected, encapsulated, and cured as discussed above.

In some instances, where the assembly surface is electrically conductive (metallic), an intermediary dielectric layer between the assembly and additively manufactured RTD 10, such as a non-conductive ink like DuPont BQ10 or ME777, or an integrally bonded layer such as polyimide (Kapton®) or an epoxy-fiberglass may be used. The typical thickness of a dielectric layer depends on the dielectric strength of the material and as a result may vary between 0.0005" and 0.010" thick. The dielectric layer may not be necessary for certain types of composite surfaces. This dielectric layer acts as an insulator and adhesive between the component surface and the additive manufactured RTD. The dielectric layer, like the flexible substrate in the first embodiment, must be able to withstand temperatures, light, and other environmental factors so that additively manufactured RTD 10 maintains its adhesion to the component.

In either example, RTD 10 adheres to and matches the geometry of the surface of the component to which it is applied. This allows for greater fatigue resistance over the lifespan of the component and RTD 10. Ideally, the conductive ink printed on substrate 14 has similar coefficient of thermal expansion (CTE) values compared to substrate 14, reducing additional fatigue. Moreover, multiple applications of RTD 10 conductive ink to form one or more layers allows for varying thickness and resistance of RTD 10 as needed on the component.

Additively manufactured RTDs have a longer lifespan than Prior Art etched metal or wire wound components, due to the flexible nature of additively manufactured RTD substrates and inks. RTDs made through additive manufacturing can be used in higher strain environments and applications, such as rotor blades, to achieve equivalent control performance. For instance, additively manufactured RTDs can withstand strain ranges of between 2000 and 6000 microstrain. Additively manufactured RTDs have longer lifespans and allow for longer time between required replacements compared with Prior Art RTDs.

Additively manufactured RTDs can also be applied to geometrically complex surfaces. In one embodiment, additively manufactured RTDs can be applied to wing leading edge assemblies, such as assembly 20 in FIGS. 2A-2B. Alternative embodiments of other aircraft components to which an additively manufactured RTD can be applied include but are not limited to floor panels, rotor blades, horizontal stabilizers, vertical stabilizers, heated inlets, or other composite or metallic components for use in aircraft including components that are heated in use.

Figures 2A, 2B:
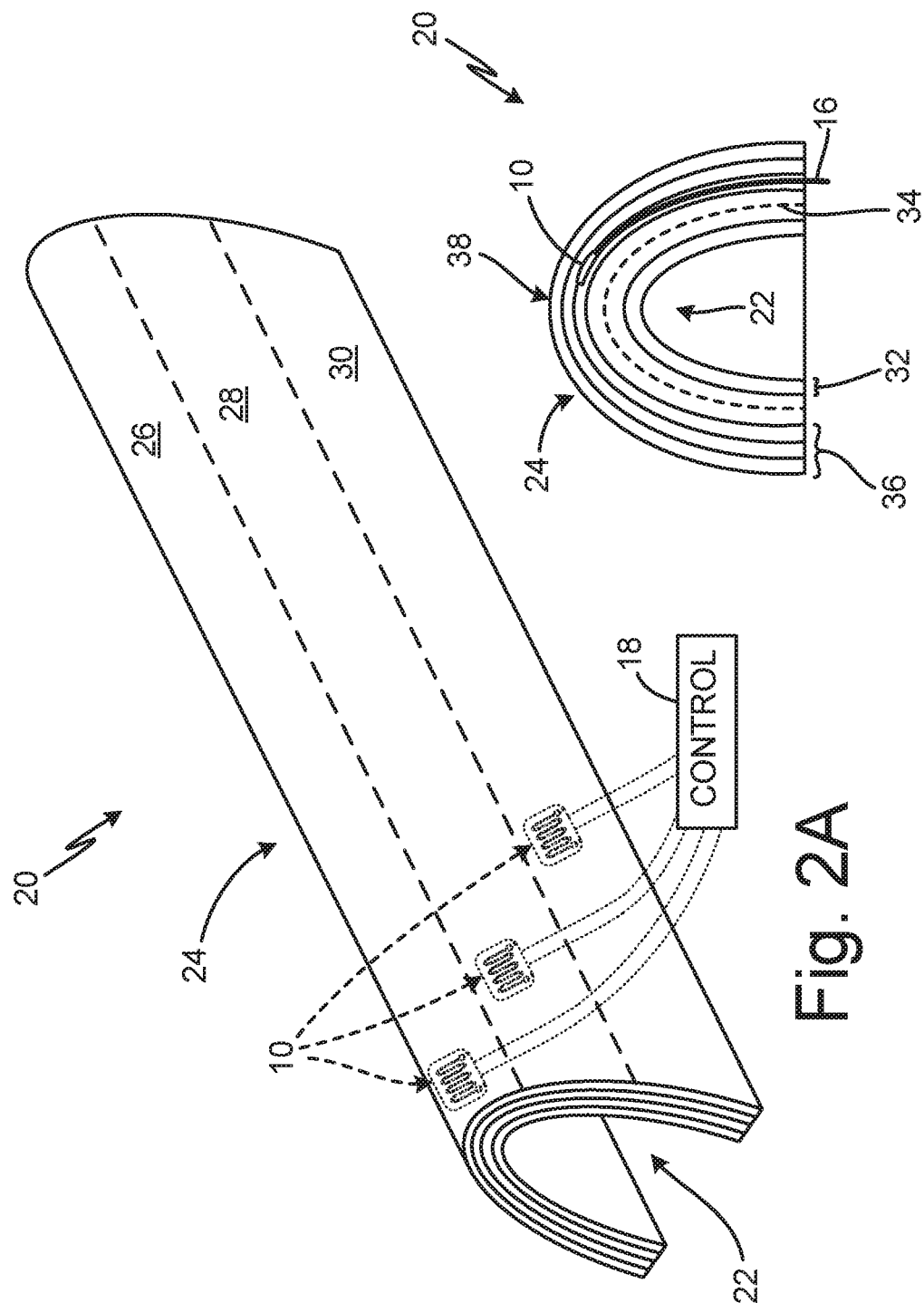
FIG. 2A is an isometric view of an additive manufactured RTD on a leading edge assembly.
FIG. 2B is a cross sectional view of an additive manufactured RTD on a leading edge assembly.

FIG. 2A is an isometric view of additively manufactured RTDs 10 on leading edge assembly 20. FIG. 2B is a cross sectional view of assembly 20. FIGS. 2A and 2B will be discussed together. Assembly 20 has internal surface 22, and external surface 24, and three heated area zones 26, 28, 30. Assembly 20 includes, from internal surface 22 to external surface 24, first set of structural plies 32, heating element 34, second set of structural plies 36, and erosion shield 38. RTDs 10 with leads 16 are embedded within second set of structural plies 36. Controller 18 is connected to RTDs 10 on assembly 20 through leads 16.

Structural plies 32, 36, provide structural support to the leading edge. Heating element 34 provides heat for ice protection purposes. Erosion shield 38 provides protection for external surface 24 of the leading edge from, for example, foreign objects.

In leading edge assembly 20, sections 26, 28, 30, all have different heating requirements. For this reason, this embodiment shows three RTDs 10 embedded in structural plies 36 of each section 26, 28, 30. Each RTD 10 is at a location that will correlate the hottest portion of the heated section. Each RTD 10 is connected by leads 16 to an electrical source so that resistance of each RTD 10 can be measured and correlated to surface temperature of each section 26, 28, and 30. A person of skill in the art would understand that the number of RTD used in any particular embodiment can be varied depending on the requirements in that embodiment. Controller 18 is able to monitor temperatures at each of RTDs 10 and determine if any section 26, 28, 30, needs to be switched off to prevent the corresponding section from overheating.

RTDs 10 in assembly 20 have greater fatigue life than Prior Art temperature sensors, and due to their repeatable nature are reliable when detecting temperatures on a component such as a leading edge.

Discussion of Possible Embodiments

The following are non-exclusive descriptions of possible embodiments of the present invention.

An assembly includes a resistance temperature detector for a component, one or more leads electrically connected to the resistance temperature detector, and a controller electrically connected to the resistance temperature detector through the one or more leads. The resistance temperature detector is configured to change resistance as the component temperature changes. The resistance temperature detector is additively manufactured and includes one or more layers of a conductive ink.

The assembly of the preceding paragraph can optionally include, additionally and/or alternatively, any one or more of the following features, configurations and/or additional components:

The component comprises an engine inlet, a rotor blade, a wing, a floor panel, a guide vane, an ice protection assembly, a horizontal stabilizer, a vertical stabilizer, or a tank.

The resistance temperature detector resides on a flexible substrate, and wherein the substrate is attached to the component.

The flexible substrate is selected from the group consisting of neoprene, TPU, polyimide, urethane, glass fabric, pre-impregnated fabric, and combinations thereof.

The resistance temperature detector resides directly on a surface of the component.

The assembly includes an intermediary dielectric layer between the surface of the component and the resistance temperature detector.

The intermediary dielectric layer has a thickness between 0.0005 inches and 0.030 inches.

The resistance temperature detector is encapsulated with a dielectric material selected from the group consisting of acrylic, neoprene, polyurethane, polyimide, silicone, and an epoxy-fiberglass matrix.

A resistance temperature detector includes an additively manufactured resistance element that changes resistance value as its temperature changes, wherein the resistance element comprises one or more layers of a conductive ink, and one or more electrical leads connected to the resistance element.

The component of the preceding paragraph can optionally include, additionally and/or alternatively, any one or more of the following features, configurations and/or additional components:

The resistance element has a resistance between 150 and 2500 ohms.

The resistance element has a resistance between 200 and 1000 ohms.

The resistance element has a thickness between 0.0001"-0.010", and wherein each of the one or more layers has a thickness of 1-100 microns.

The resistance element can detect temperature between −40 and 400 degrees Fahrenheit.

The conductive ink selected from the group consisting of carbon loaded, nano-carbon loaded, and nano-silver conductive inks.

A method of making a resistance temperature detector includes additively manufacturing a conductive ink element having one or more layers of conductive ink to form a resistance element, and electrically connecting the resistance element with one or more leads.

The method of the preceding paragraph can optionally include, additionally and/or alternatively, any one or more of the following features, configurations and/or additional components:

The conductive ink element comprises carbon, nano-carbon, or nano-silver particles.

Additively manufacturing comprises screen printing, ink-jet printing, or aerosol-jet printing.

The method includes applying the resistance element on a component surface.

The method includes applying the resistance element on a flexible substrate material.

The method includes encapsulating the resistance temperature detector.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An assembly comprising:
   an aircraft component that is heated when in use;
   a resistance temperature detector element for the aircraft component, the resistance temperature detector element configured to change resistance as the aircraft component temperature changes, wherein the resistance temperature detector element is additively manufactured such that the resistance temperature detector element has a thickness between 0.0001 inches and 0.010 inches and includes a plurality of layers of a conductive ink deposited through individual passes of a print head, each layer of the conductive ink has a thickness of about 1 micron to about 100 microns, the resistance temperature detector element is a flexible element capable of withstanding a strain range of between 2000 and 6000 microstrain, and the resistance temperature detector element adheres to and conformally matches the geometry of a surface of the aircraft component;
   one or more leads electrically connected to at least one layer of the conductive ink within the resistance temperature detector element; and
   a controller electrically connected to the resistance temperature detector element through the one or more leads, wherein the controller is configured to analyze temperature data from the resistance temperature detector element to determine the power ON and OFF times for the aircraft component that is heated when in use.

2. The assembly of claim 1, wherein the aircraft component comprises an engine inlet, a rotor blade, a wing, a floor panel, a guide vane, an ice protection assembly, a horizontal stabilizer, a vertical stabilizer, or a tank.

3. The assembly of claim 1, wherein the resistance temperature detector element resides on a flexible substrate, and wherein the flexible substrate is attached to the aircraft component.

4. The assembly of claim 3, wherein the flexible substrate is selected from the group consisting of neoprene, TPU, polyimide, urethane, glass fabric, pre-impregnated fabric, and combinations thereof.

5. The assembly of claim 1, wherein the resistance temperature detector element resides directly on a surface of the aircraft component.

6. The assembly of claim 5, further comprising an intermediary dielectric layer between the surface of the aircraft component and the resistance temperature detector element.

7. The assembly of claim 6, wherein the intermediary dielectric layer has a thickness between 0.0005 inches and 0.030 inches.

8. The assembly of claim 1, wherein the resistance temperature detector element is encapsulated with a dielectric material selected from the group consisting of acrylic, neoprene, polyurethane, polyimide, silicone, and an epoxy-fiberglass matrix.

9. A resistance temperature detector comprising:
   an additively manufactured resistance element that changes resistance value as its temperature changes, wherein the resistance element has a thickness between 0.0001 inches and 0.010 inches, the resistance element comprises one or more layers of a conductive ink selected from the group consisting of carbon loaded, nano-carbon loaded, and nano-silver conductive inks deposited through individual passes of a print head, each layer of the conductive ink has a thickness of about 1 micron to about 100 microns, the resistance temperature detector element is a flexible element capable of withstanding a strain range of between 2000 and 6000 microstrain, and the resistance temperature detector element adheres to and conformally matches the geometry of a surface of an aircraft component that is heated when in use; and one or more electrical leads connected to at least one layer of the conductive ink within the resistance element, wherein the electrical leads connect the resistance element to a controller which is configured to analyze temperature data from the resistance temperature detector to determine the power ON and OFF times for the aircraft component.

10. The resistance temperature detector of claim 9, wherein the resistance element has a resistance between 150 and 2500 ohms.

11. The resistance temperature detector of claim 10, wherein the resistance element has a resistance between 200 and 1000 ohms.

12. The resistance temperature detector of claim 9, wherein the resistance element can detect temperature between −40 and 400 degrees Fahrenheit.

13. A method of making a resistance temperature detector comprising:

additively manufacturing a conductive ink resistance element having one or more layers of a conductive ink to form a resistance element, wherein additively manufacturing comprises screen printing, ink-jet printing, or aerosol-jet printing, additively manufacturing the conductive ink resistance element further comprises performing individual passes of a print head to form each layer of conductive ink, each layer of the conductive ink has a thickness of about 1 micron to about 100 microns, the conductive ink resistance element has a thickness between 0.0001 inches and 0.010 inches, the conductive ink comprises carbon, nano-carbon, or nano-silver particles, the resistance temperature detector is a flexible element capable of withstanding a strain range of between 2000 and 6000 microstrain, and the conductive ink resistance element adheres to and conformally matches the geometry of a surface of an aircraft component that is heated when in use;

applying the conductive ink resistance element to the aircraft component; and electrically connecting the conductive ink resistance element to a controller with one or more leads, wherein the one or more leads are connected to at least one layer of conductive ink within the conductive ink resistance element and the controller is configured to analyze temperature data from the resistance temperature detector to determine the power ON and OFF times for the aircraft component that is heated when in use.

14. The method of claim 13, further comprising encapsulating the resistance temperature detector.

* * * * *